(12) United States Patent
Inoue

(10) Patent No.: US 7,851,879 B2
(45) Date of Patent: Dec. 14, 2010

(54) IMAGING DEVICE COMPRISING SHIELDING UNIT WHICH SHIELDS LIGHT INCIDENT FROM IMAGING AREA TO OPTICAL BLACK AREA AND METHOD OF MANUFACTURING THE SAME

(75) Inventor: Ikuko Inoue, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 84 days.

(21) Appl. No.: 12/248,427

(22) Filed: Oct. 9, 2008

(65) Prior Publication Data

US 2009/0108389 A1      Apr. 30, 2009

(30) Foreign Application Priority Data

Oct. 12, 2007    (JP)    ............................. 2007-267227

(51) Int. Cl.
  *H01L 27/146*   (2006.01)
  *H01L 27/14*    (2006.01)
(52) U.S. Cl. .................. 257/435; 257/414; 257/431; 257/E31.127; 257/E31.001; 438/70
(58) Field of Classification Search ................ 257/435, 257/E31.001, 414, 431, E31.127; 438/70
  See application file for complete search history.

(56) References Cited

U.S. PATENT DOCUMENTS

| | | | | |
|---|---|---|---|---|
| 6,987,537 | B2 * | 1/2006 | Inoue | 348/308 |
| 7,205,623 | B2 * | 4/2007 | Hong et al. | 257/435 |
| 2008/0105908 | A1 | 5/2008 | Lee | |

FOREIGN PATENT DOCUMENTS

| | | |
|---|---|---|
| JP | 2001-298175 | 10/2001 |
| JP | 2006-93687 | 4/2006 |

* cited by examiner

*Primary Examiner*—Ngan Ngo
*Assistant Examiner*—Benjamin Tzu-Hung Liu
(74) *Attorney, Agent, or Firm*—Oblon, Spivak, McClelland, Maier & Neustadt, L.L.P.

(57) ABSTRACT

An imaging device according to an example of the invention comprises a first photoelectric conversion unit which is formed at an imaging area of a substrate, a second photoelectric conversion unit for black reference observation which is formed at an optical black area between the imaging area of the substrate and a peripheral circuit area where a peripheral circuit is formed, an insulating film which is formed on the imaging area and the optical black area of the substrate, and a shielding unit which is formed by connecting a contact and an interconnect in an accumulating direction of the insulating film from the substrate surface to the insulating film surface.

18 Claims, 9 Drawing Sheets

IMAGING DEVICE COMPRISING SHIELDING UNIT WHICH SHIELDS LIGHT INCIDENT FROM IMAGING AREA TO OPTICAL BLACK AREA AND METHOD OF MANUFACTURING THE SAME

CROSS-REFERENCE TO RELATED APPLICATIONS

This application is based upon and claims the benefit of priority from prior Japanese Patent Application No. 2007-267227, filed Oct. 12, 2007, the entire contents of which are incorporated herein by reference.

BACKGROUND OF THE INVENTION

1. Field of the Invention

The present invention relates to a solid-state imaging device and a method of manufacturing the same.

2. Description of the Related Art

A MOS solid-state imaging element (image pickup element) has advantages of low power voltage, single power source and low cost. Recently, there is a rapid trend to make the solid-state imaging device which comprises a MOS solid-state imaging element fine. Therefore, Cu interconnect (wiring) which is appropriate for fine interconnect tends to be utilized more often than Al interconnect for interconnect in the solid-state imaging device (image pickup device).

In comparison with the Al interconnect, the Cu interconnect is resistant to electro-migration and can have a low profile due to manufacturing by a damascene process. Therefore, for the solid-state imaging device which comprises a microlens at the top layer, condensing light can be easy and sensitivity can be improved. On the other hand, for a logic circuit which is disposed in the solid-state imaging device, fining and integration can be achieved by utilizing the Cu interconnect. Accordingly, decreasing the area of the circuit and downsizing the module can be achieved.

However, when the Cu interconnect is utilized in the damascene process, there is a case that a part of large area such as a shielding layer is shaped as a recessed dish-shape which is called dishing caused by filling of Cu into a dug interlayer film. Therefore, it is difficult to utilize the Cu interconnect for a part of large area. Consequently, it is common to utilize the Cu interconnect for lower layer interconnect which requires fine processing and to utilize the Al interconnect for upper layer interconnect which design requirement is not so severe.

Document 1 (Jpn. Pat. Appln. KOKAI Publication No. 2001-298175) discloses a solid-state imaging device on which a variety of circuits are mounted which realizes high signal processing speed and integration with the imaging area (image pickup area) being low-risen for improving sensitivity and the peripheral circuits being multi-layered.

An image sensor of document 2 (Jpn. Pat. Appln. KOKAI Publication No. 2006-093687) has a shielding area which light shielding effect is superior by forming a metal layer pattern, a dummy pattern and an upper shielding film pattern.

In the solid-state imaging device on which the variety of circuits are mounted of document 1, downsizing is performed by high speed signal processing and integration with the imaging area being low-risen for improving sensitivity and the peripheral circuits being multi-layered.

However, when the imaging area is low-risen and the peripheral circuits are multi-layered while utilizing the damascene Cu interconnect structure, the shielding layer position becomes high due to the multi-layering of the peripheral circuits and precise determining of a black reference level becomes difficult because inclined incident light enters into the optical black (OB) area which determines the zero level of a pixel.

Further, with a conventional solid-state imaging device, an invalid area (dummy area) needs to be enlarged in order to appropriately ensure the black reference level. Consequently, downsizing of the solid-state imaging device becomes difficult.

In document 2, it is not examined for entering of the inclined incident light to the OB area from the imaging area.

BRIEF SUMMARY OF THE INVENTION

An imaging device according to the first example of this invention comprises a first photoelectric conversion unit which is formed at an imaging area of a semiconductor substrate, a second photoelectric conversion unit for black reference observation which is formed at an optical black area between the imaging area of the semiconductor substrate and a peripheral circuit area where a peripheral circuit is formed, an insulating film which is formed on the imaging area and the optical black area of the semiconductor substrate, and a shielding unit which is formed by connecting a contact and an interconnect in an accumulating direction of the insulating film from the semiconductor substrate surface to the insulating film surface.

A method of manufacturing an imaging device according to the second example of this invention comprises forming an element isolation area on a semiconductor substrate for performing element isolation among an imaging area, an optical black area and a peripheral circuit area and isolating an element within each of the areas, forming an electronic circuit including a photoelectric conversion layer at the imaging area and the optical black area of the semiconductor substrate and forming a peripheral circuit at the peripheral circuit area, accumulating an insulating film on the semiconductor substrate to which the electronic circuit and the peripheral circuit are formed, forming a shielding unit in which a contact and an interconnect are connected in an accumulating direction of the insulating film from the semiconductor substrate surface to the insulating film surface, and forming a color filter and a microlens at the imaging area of the semiconductor substrate.

DETAILED DESCRIPTION OF THE INVENTION

In the following, embodiments of the present invention are explained with reference to the drawings. Here, the same numeral is given and explanation is omitted for the parts realizing a similar function of each drawing in the following.

The First Embodiment

In the present embodiment, a solid-state imaging device which shields light incident in an inclined direction from an imaging area to an OB area.

Figure 1:
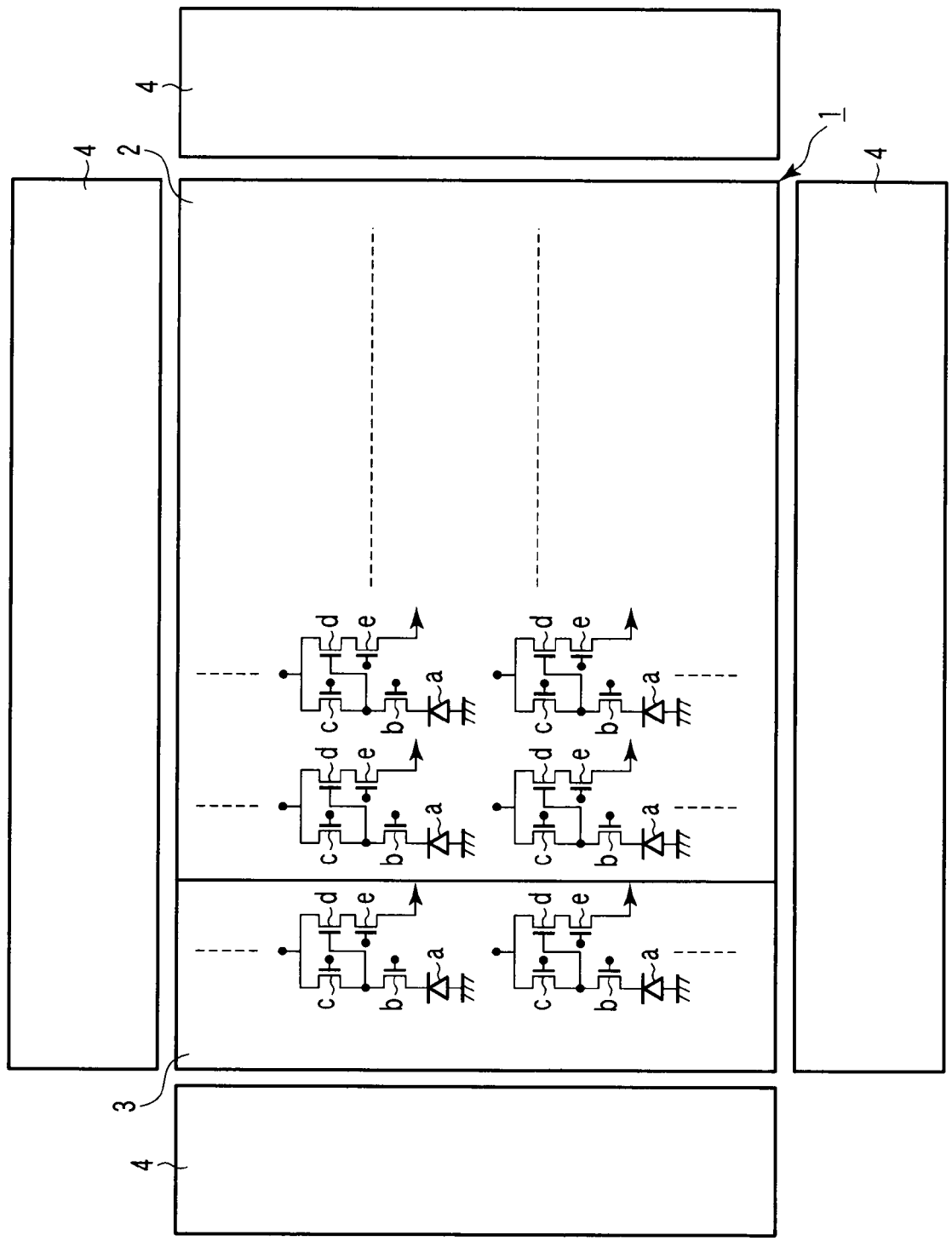
FIG. 1 is a plane view which shows an example of a circuit structure of a solid-state imaging device according to a first embodiment of a present invention.

FIG. 1 is a plane view which shows an example of a circuit structure of the solid-state imaging device according to the present embodiment.

Figure 2:
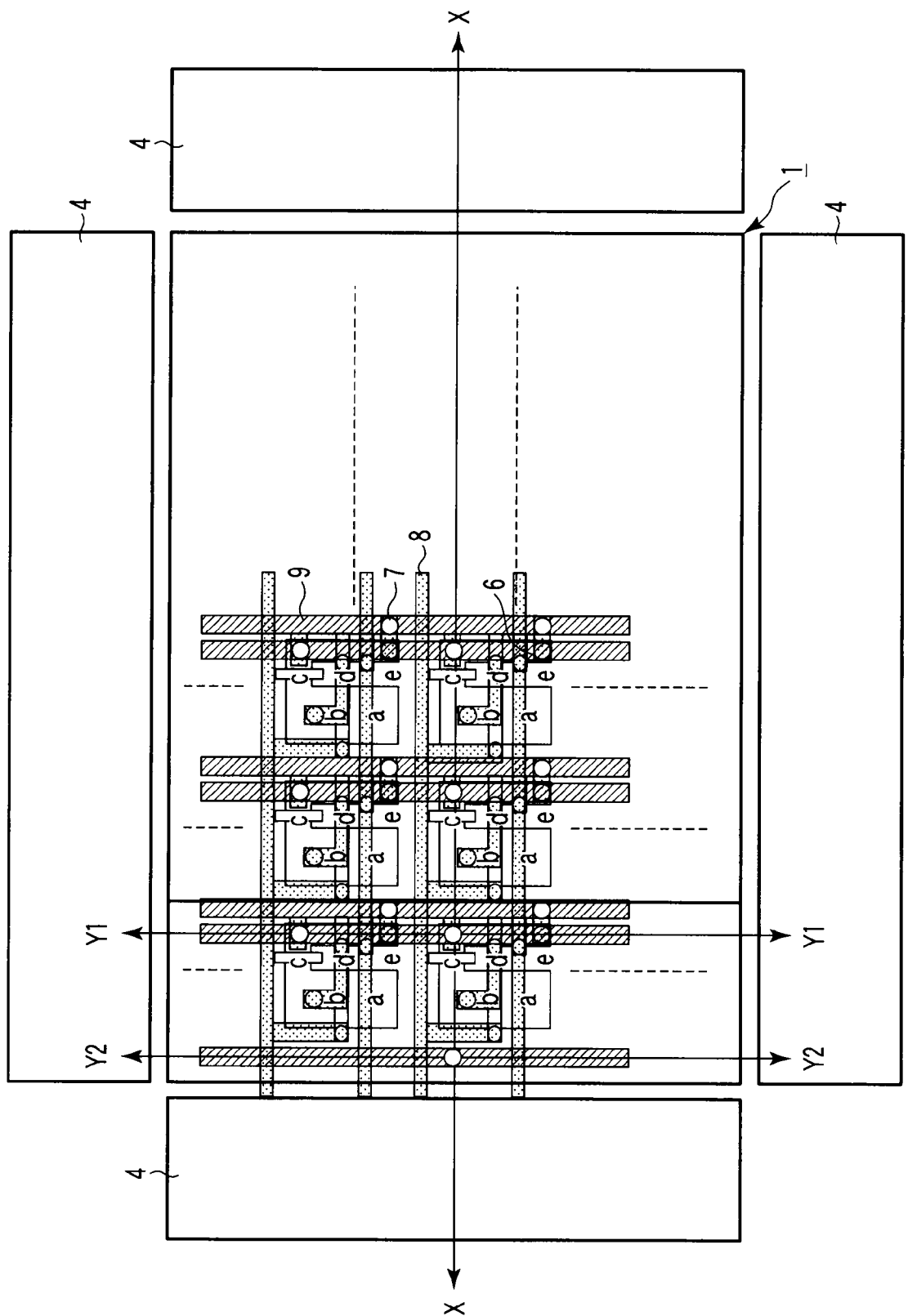
FIG. 2 is a plane view which shows a layout structure of the solid-state imaging device according to the first embodiment.

FIG. 2 is a plane view which shows a layout structure of the solid-state imaging device according to the present embodiment.

The solid-state imaging device 1 according to the present embodiment is structured so that a MOS solid-state imaging element (MOS sensor) and the peripheral circuit are formed on one chip.

In the horizontal direction (first direction) of FIGS. 1 and 2, the optical black (OB) area 3 is formed at one end side of the imaging area 2, and the peripheral circuit area 4 is formed further ahead of the OB area 3. Namely, at one end side of the imaging area, the OB area 3 is formed between the imaging area 2 and the peripheral circuit area 4. Further, the peripheral circuit area 4 is also formed at the other end side of the imaging area 2.

In the vertical direction (second direction perpendicular to the first direction) of FIGS. 1 and 2, the peripheral circuit areas 4 are arranged at both ends of the imaging area 2.

Here, the OB area 3 may also be formed along the periphery of the imaging area 2 to surround all or a selective part of the periphery of the imaging area 2.

The peripheral circuit area 4 may also be formed along the periphery of the combined area of the OB area 3 and the imaging area 2 to surround all or a selective part of the periphery of the combined area.

As shown in FIGS. 1 and 2, pixels in which a photoelectric conversion unit "a" including a photoelectric conversion layer, a reading transistor "b", a reset transistor "c", an amplifying transistor "d" and a selecting transistor "e" are formed as one unit are arranged as a matrix shape at the imaging area 2 and the OB area 3 where the MOS solid-state imaging element is formed. Each of the pixels is connected to contacts 6, 7 and interconnects 8, 9.

Figure 3:
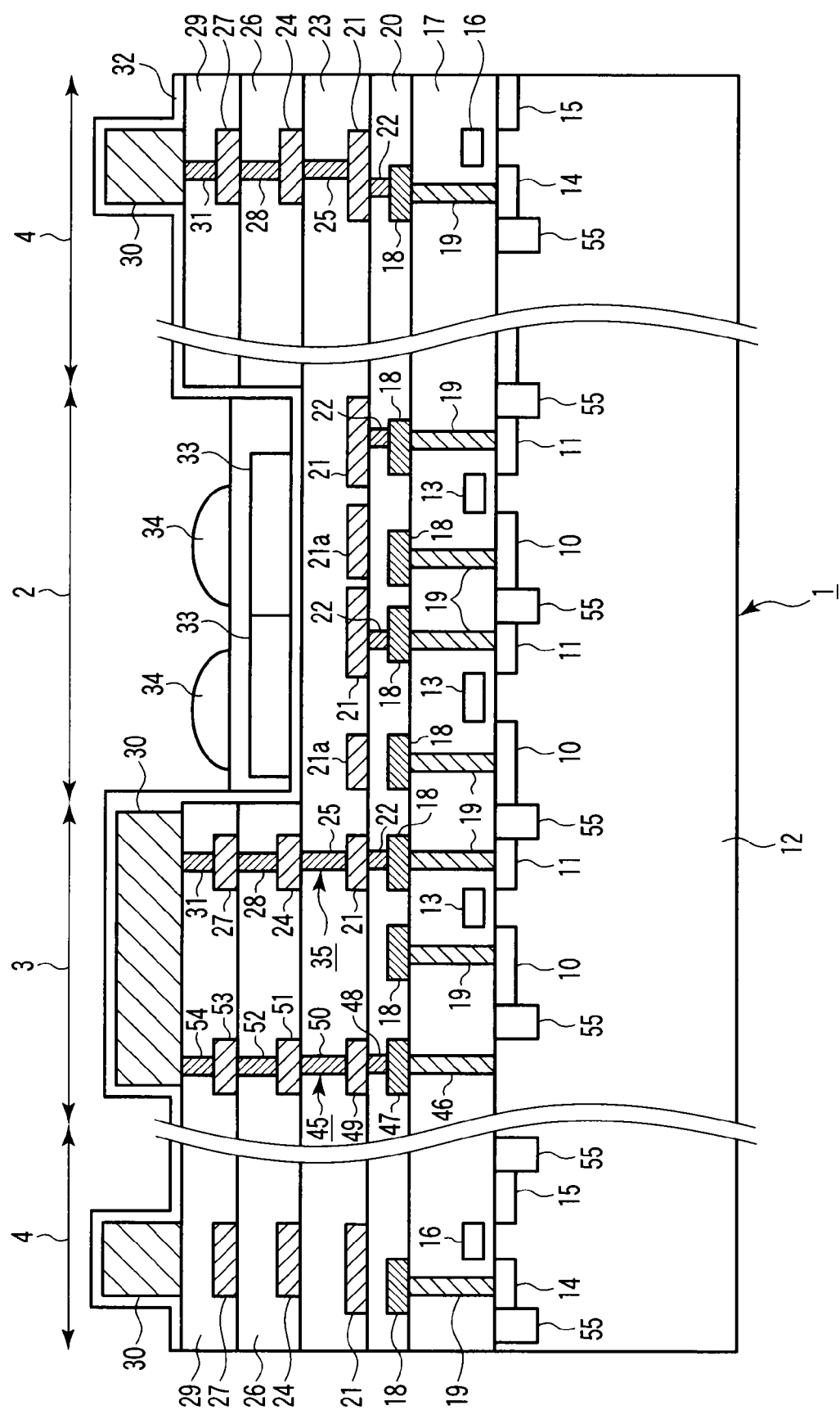
FIG. 3 is a sectional view in X-X of FIG. 2 which shows a first example of a section structure of the solid-state imaging device according to the first embodiment.

FIG. 3 is a sectional view in X-X of FIG. 2 which shows the first example of a section structure of the solid-state imaging device 1 according to the present embodiment.

A charge storage layer 10 which converts electrode picture image light signal into image electric signal and a diffusion layer 11 are formed at the imaging area 2 and the OB area 3. A gate electrode 13 of the reset transistor "c" is formed between the charge storage layer 10 and the diffusion layer 11 on a semiconductor substrate 12 via a gate insulating film which is not shown in the figures. The MOS solid state imaging element is structured by the charge storage layer 10, the diffusion layer 11, the gate electrode 13 and photoelectric conversion layer (not shown in figures). As mentioned above, the MOS solid state imaging elements are arranged as a matrix state at the imaging area 2 and the OB area 3.

The zero level of the pixel is determined based on the signal detected by the MOS solid state imaging element which is formed at the OB area 3.

The peripheral circuit area 4 is element-isolated (element-separated) from the imaging area 2 and the OB area 3 with an element isolation area 55 which is formed of insulating material. A MOS transistor which configures the peripheral circuit is formed on the semiconductor substrate 12 of the peripheral circuit area 4.

The MOS transistor at the peripheral circuit area 4 has a source area 14 and a drain area 15 which comprises a diffusion layer formed on the semiconductor substrate 12 and a gate electrode 16 formed on the semiconductor substrate 12 between the source area 14 and the drain area 15 via the gate insulating film which is not shown in the figures.

A first insulating film 17 which front face side (side on which light enters) is flattened covers the gate electrode 16, the source area 14, the drain area 15, the charge storage layer 10, the diffusion layer 11 and the gate electrode 13. A first interconnect layer 18 which comprises Cu, for example, is formed on the front face of the first insulating film 17.

At the peripheral circuit area 4, the first interconnect layer 18 is connected to either of the source area 14 and the drain area 15 via a contact 19 which penetrates the first insulating film 17.

At the imaging area 2 and the OB area 3, the first interconnect layers 18 are connected to the charge storage layer 10 or the diffusion layer 11 via the contact 19 which penetrates the insulating film 17. In this manner, the diffusion layer 11 is connected to the first interconnect layer 18 via the contact 19 which is disposed at the first insulating film 17.

The first interconnect layer 18 is covered by a second insulating film 20 which front face side is flattened. A second interconnect layer 21 which comprises Cu, for example, is formed on the front face of the second insulating film 20 at the imaging area 2, the OB area 3 and the peripheral circuit area 4.

The second interconnect layer 21 is connected to the first interconnect layer 18 via a contact 22 which penetrates the second insulating film 20 at a desired position.

The second interconnect layer 21 is covered by a third insulating film 23 which front face side is flattened. A third interconnect layer 24 which comprises Cu, for example, is formed on the front face side of the third insulating film 23 at the OB area 3 and the peripheral circuit area 4.

The third interconnect layer 24 is connected to the second interconnect layer 21 via a contact 25 which penetrates the third insulating film 23 at a desired position.

The third interconnect layer 24 is covered by a fourth insulating film 26 which front face side is flattened at the OB area 3 and the peripheral circuit area 4. A fourth interconnect layer 27 which comprises Cu, for example, is formed on the front side of the fourth insulating film 26 at the OB area 3 and the peripheral circuit area 4.

The forth interconnect layer 27 is connected to the third interconnect layer 24 via a contact 28 which penetrates the fourth insulating film 26 at a desired position.

The fourth interconnect layer 27 is covered by a fifth insulating film 29 which front face side is flattened at the OB area 3 and the peripheral circuit area 4. A fifth interconnect layer 30 is formed on the front face of the fifth insulating film 29 at the OB area 3 and the peripheral circuit area 4.

The fifth interconnect layer 30 is connected to the fourth interconnect layer 27 via a contact 31 which penetrates the fifth insulating film 29 at a desired position.

A shielding film 21a which comprises Cu is formed at an area of the imaging area 2 excluding the area where the photoelectric conversion layer is formed. In the present embodiment, the second interconnect layer 21 and the shielding film 21a form the same layer.

The fifth interconnect layer 30 becomes a shielding film at the OB area 3.

A flattening layer 32 covers the fifth insulating film 29 and the fifth interconnect layer 30 at the OB area 3 and the peripheral circuit area 4, the front face side of the third insulating film 23 at the imaging area 2 and a side face portion of the OB area 3 which is generated by the thickness difference between the imaging area 2 and the OB area 3.

A color filter 33 for isolating specific wavelength light and a microlens 34 for condensing image light signals into the photoelectric conversion layer are disposed at the front face side of the flattening layer 32 at the imaging area 2, namely the area above the first through the third insulating films 17, 20, 23 which are accumulated on the photoelectric conversion layer (side on which light enters).

The front face of the insulating film (first through third insulating films 17, 20, 23) at the imaging area 2 is configured to be lower than the front face of the insulating film (first through fifth insulating films 17, 20, 23, 26, 29) at the peripheral circuit area 4 by flattening. In this manner, by forming the insulating film at the imaging area 2 to be thinner than the insulating film at the peripheral circuit area 4, the image light signals incident upon the microlens 34 may easily be condensed into the photoelectric conversion layer and favorable image characteristics can be obtained. Further, a multi-layer interconnect structure can be realized in the peripheral circuit area 4, and enhancement of the integration and the speed of the peripheral circuit can be realized.

A shielding unit 35 of the present embodiment is formed at the OB area 3 between the imaging area 2 of the semiconductor substrate 12 and a black reference observation position of the OB area 3.

The shielding unit 35 is formed from the front face of the semiconductor substrate 12 to the front face of the fifth insulating film 29 which is located at the top layer by connecting the contact 19, the first interconnect layer 18, the contact 22, the second interconnect layer 21, the contact 25, the third interconnect layer 24, the contact 28, the fourth interconnect layer 27, the contact 31 and the fifth interconnect layer 30 in the accumulating direction of the insulating films of the first through the fifth. At the OB area 3, the contacts to connect each of the interconnect layers are formed at a minimum pitch.

In order to shield inclined incident light from the imaging area 2 side to the photoelectric conversion layer side of the OB area 3, the shielding unit 35 is formed so that at least a part of the shielding unit 35 is to be wall-shaped along all or a selective part of the periphery of the imaging area 2.

A shielding unit 45 is formed at the OB area 3 between peripheral circuit area 4 of the semiconductor substrate 12 and the black reference observation point of the OB area 3.

The shielding unit 45 is formed from the front face of the semiconductor substrate 12 to the front face of the fifth insulating film 29 which is located at the top layer by connecting a contact 46, a interconnect layer 47, a contact 48, a interconnect layer 49, a contact 50, a interconnect layer 51, a contact 52, a interconnect layer 53, a contact 54 and the fifth interconnect layer 30 in the accumulating direction of the insulating films of the first through the fifth.

In order to shield inclined incident light from the peripheral circuit area 4 side to the photoelectric conversion layer side of the OB area 3, the shielding unit 45 is formed so that at least a part of the shielding unit 45 is to be wall-shaped along all or a selective part of the inside perimeter of the peripheral circuit area 4.

Figure 4:
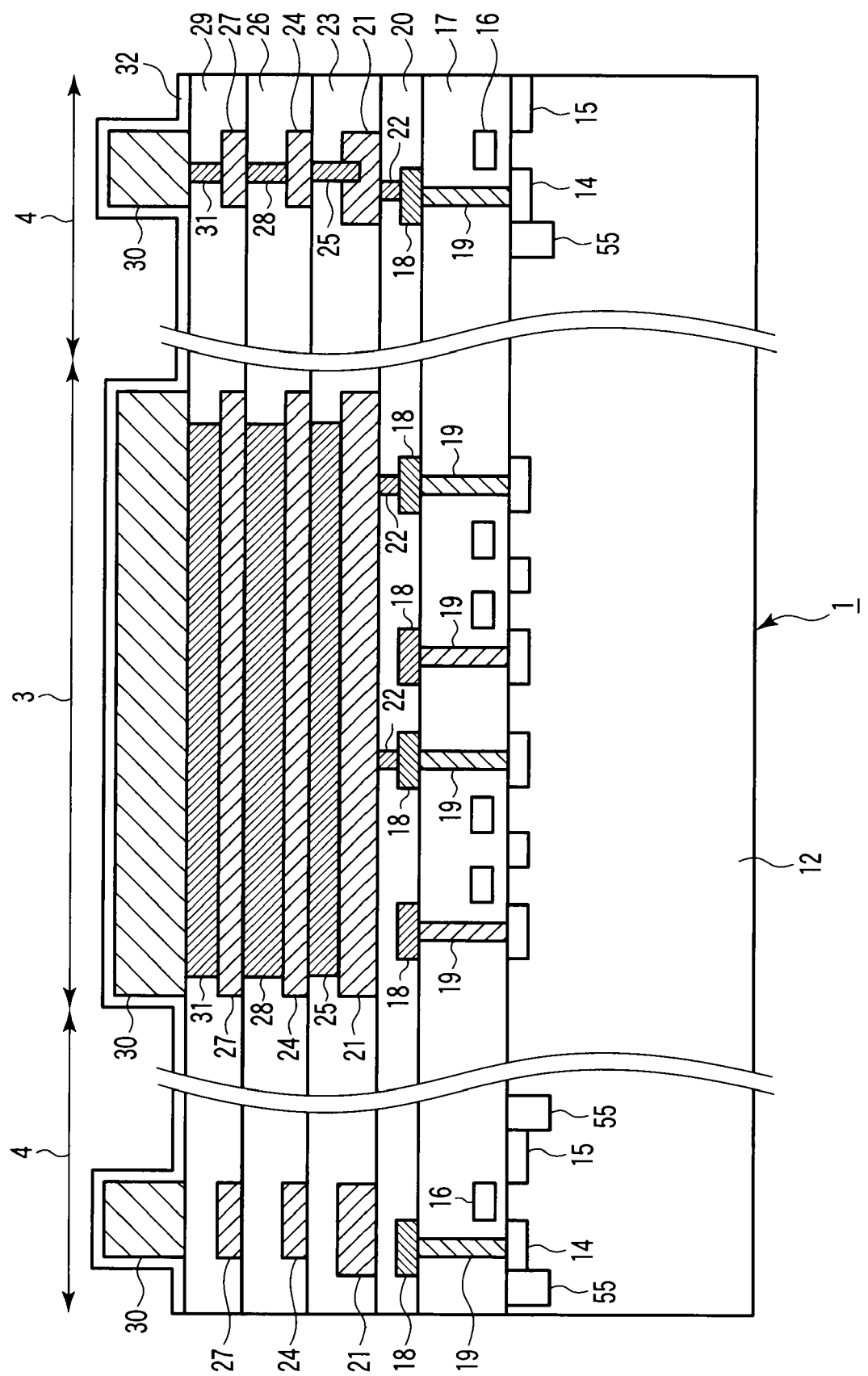
FIG. 4 is a sectional view in Y1-Y1 of FIG. 2 which shows a second example of a section structure of the solid-state imaging device according to the first embodiment.

FIG. 4 is a sectional view in Y1-Y1 of FIG. 2 which shows the second example of a section structure of the solid-state imaging device 1 according to the present embodiment.

In the solid-state imaging device 1 according to the present embodiment, the OB area 3 is sandwiched between the peripheral circuit areas 4 in Y1-Y1 direction as shown in FIG. 4.

In the present embodiment, the fifth interconnect layer 30 comprises Al and becomes the shielding film at the OB area 3, which shields inclined incident light from the imaging area 2 side to the OB area 3, as explained above.

At the OB area 3, the front face of the semiconductor substrate 12 and the fifth interconnect layer 30 are connected with the interconnect layers of the first through the fourth 18, 21, 24, 27 and the contacts 19, 22, 25, 28, 31. In particular, at the OB area 3, the contacts 25, 28, 31 which are arranged at the insulating films of the third through the fifth 23, 26, 29 and the interconnect layers of the second through the fifth 21, 24, 27, 30 are formed as a wall-shaped. Accordingly, the entering of the light incident in an inclined direction to the photoelectric conversion layer of the OB area 3 from the imaging area 2 is prevented.

As shown in FIG. 4, the shielding film 35 is wall-shaped at least at a part included in the insulating film of the OB area 3 which is higher than the insulating film of the imaging area 2. From the viewpoint of the shielding effect, it is preferable that the part therebelow is also to be wall-shaped.

Figure 5:
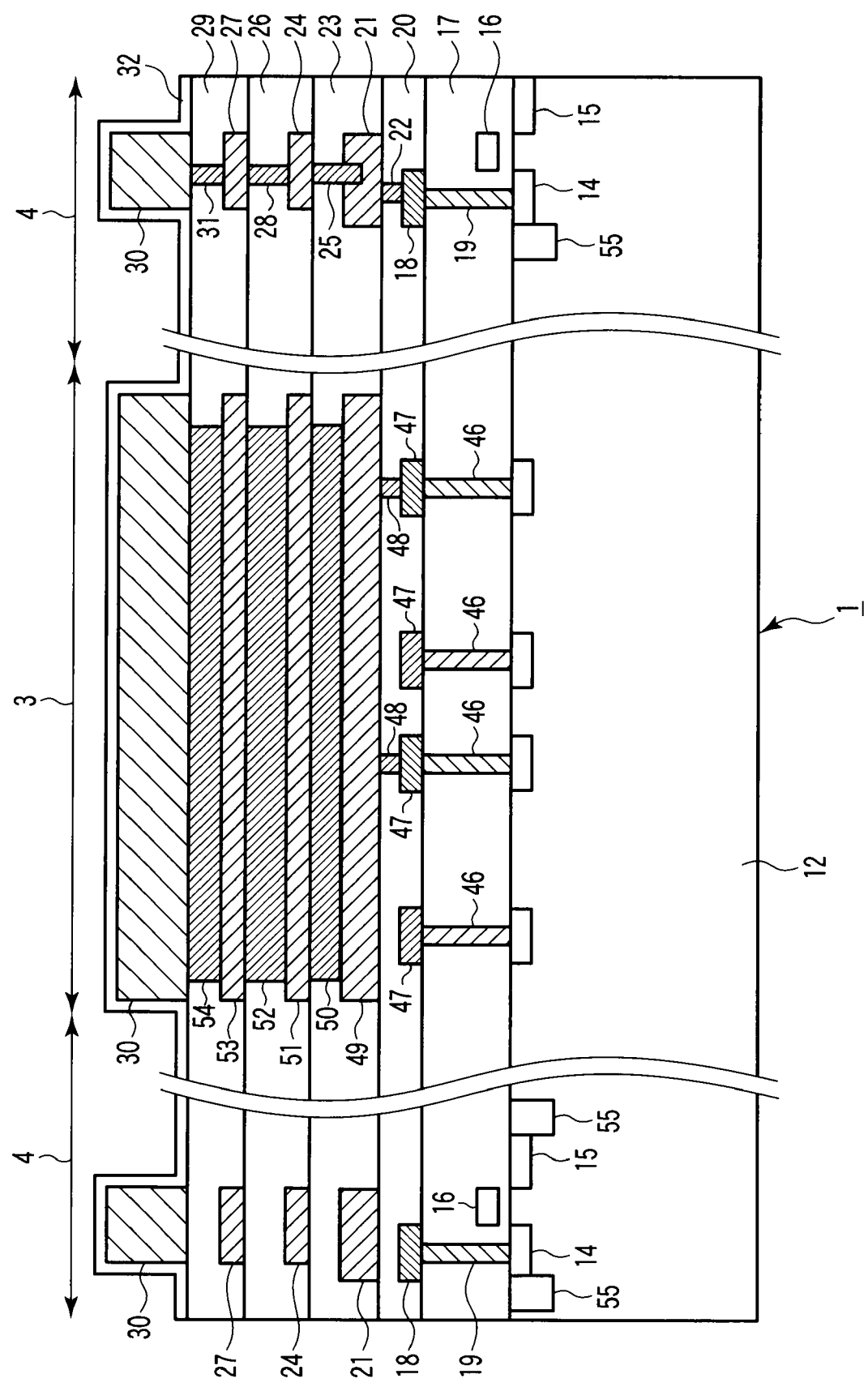
FIG. 5 is a sectional view in Y2-Y2 of FIG. 2 which shows a third example of a section structure of the solid-state imaging device according to the first embodiment.

FIG. 5 is a sectional view in Y2-Y2 of FIG. 2 which shows the third example of a section structure of the solid-state imaging device 1 according to the present embodiment.

In the solid-state imaging device 1 according to the present embodiment, the OB area 3 is sandwiched between the peripheral circuit areas 4 in Y2-Y2 direction as shown in FIG. 5.

At the OB area 3, the front face of the semiconductor substrate 12 and the fifth interconnect layer 30 are connected with the interconnect layer 46, the contact 47, the interconnect layer 48, the contact 49, the interconnect layer 50, the contact 51, the interconnect layer 52, the contact 53, the interconnect layer 54 and the fifth interconnect layer 30. In the present embodiment, the contact 49 to the fifth interconnect layer 30 is formed as a wall-shaped at the OB area 3. Accordingly, the entering of the light incident in an inclined direction to the photoelectric conversion layer of the OB area 3 from the peripheral circuit area 4 is prevented. From the viewpoint of the shielding effect, it is preferable that the front face of the semiconductor substrate 12 to the contact 48 is also to be wall-shaped.

Figure 6:
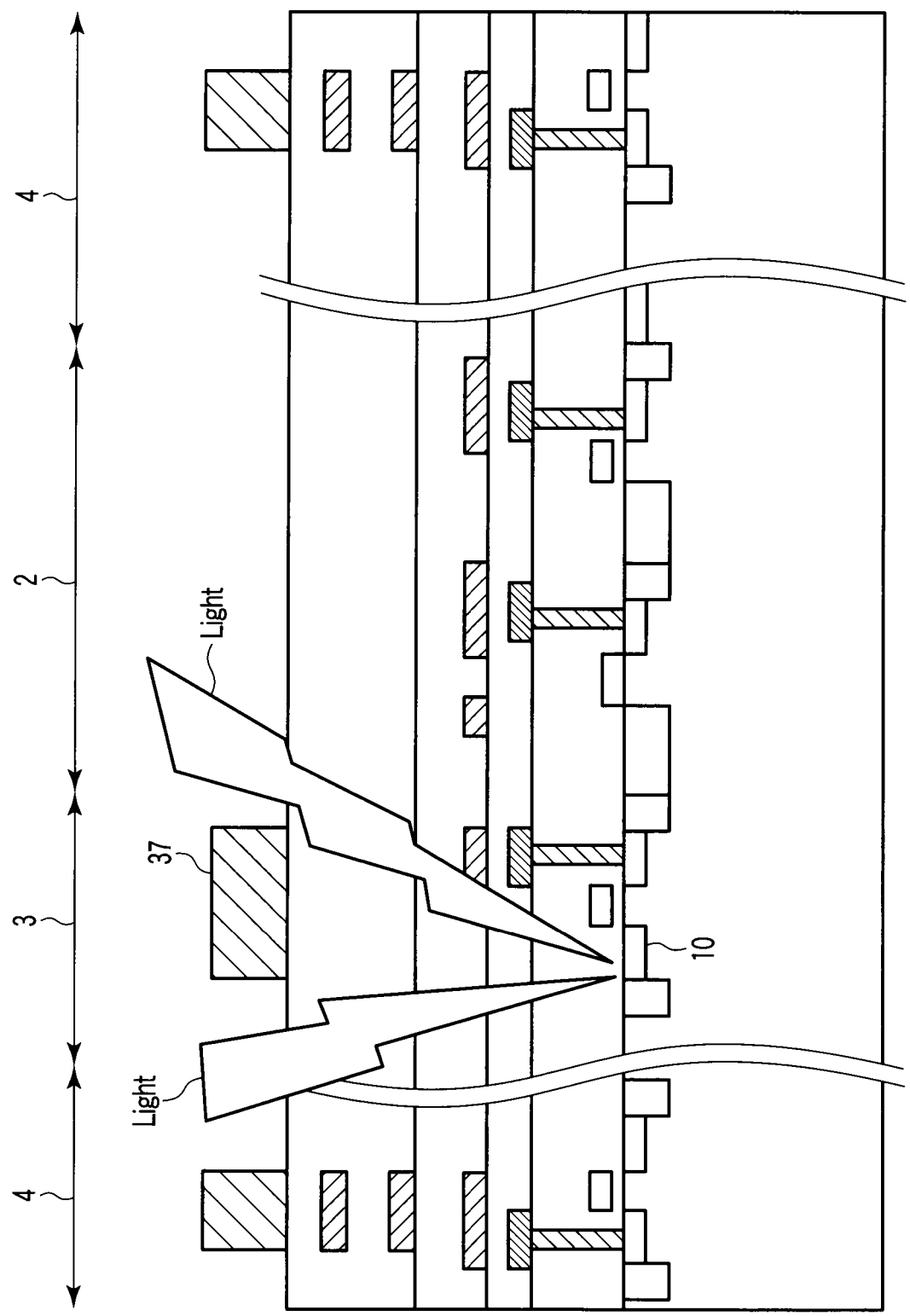
FIG. 6 is a sectional view which shows an example of a state that an inclined incident light enters into a photoelectric conversion layer of an OB area from an imaging area in a conventional solid-state imaging device.

FIG. 6 is a sectional view which shows an example of a state that the inclined incident light enters into the photoelectric conversion layer of the OB area 3 from the imaging area 2 in the conventional solid-state imaging device.

Accordingly, when the position of the shielding film 37 becomes high due to the multi-layering of the OB area 3 and the peripheral circuit area 4, there is a case that the inclined incident light enters from the side face portion of the OB area 3 into the OB area 3 which determines the zero level of a pixel, for example. When the inclined light is observed by the photoelectric conversion layer of the OB area 3, it becomes difficult to precisely determine the black reference level.

Further, there is a method for trying to shield light by forming a color filter of black or blue at the upper portion of the peripheral circuit area 4. However, with this method, there is a case that long wavelength light slightly leaks and is observed by the photoelectric conversion layer.

Further, in the conventional solid-state imaging device, there is a case that dummy pixels are arranged in order to ensure stable black reference level.

Figure 7:
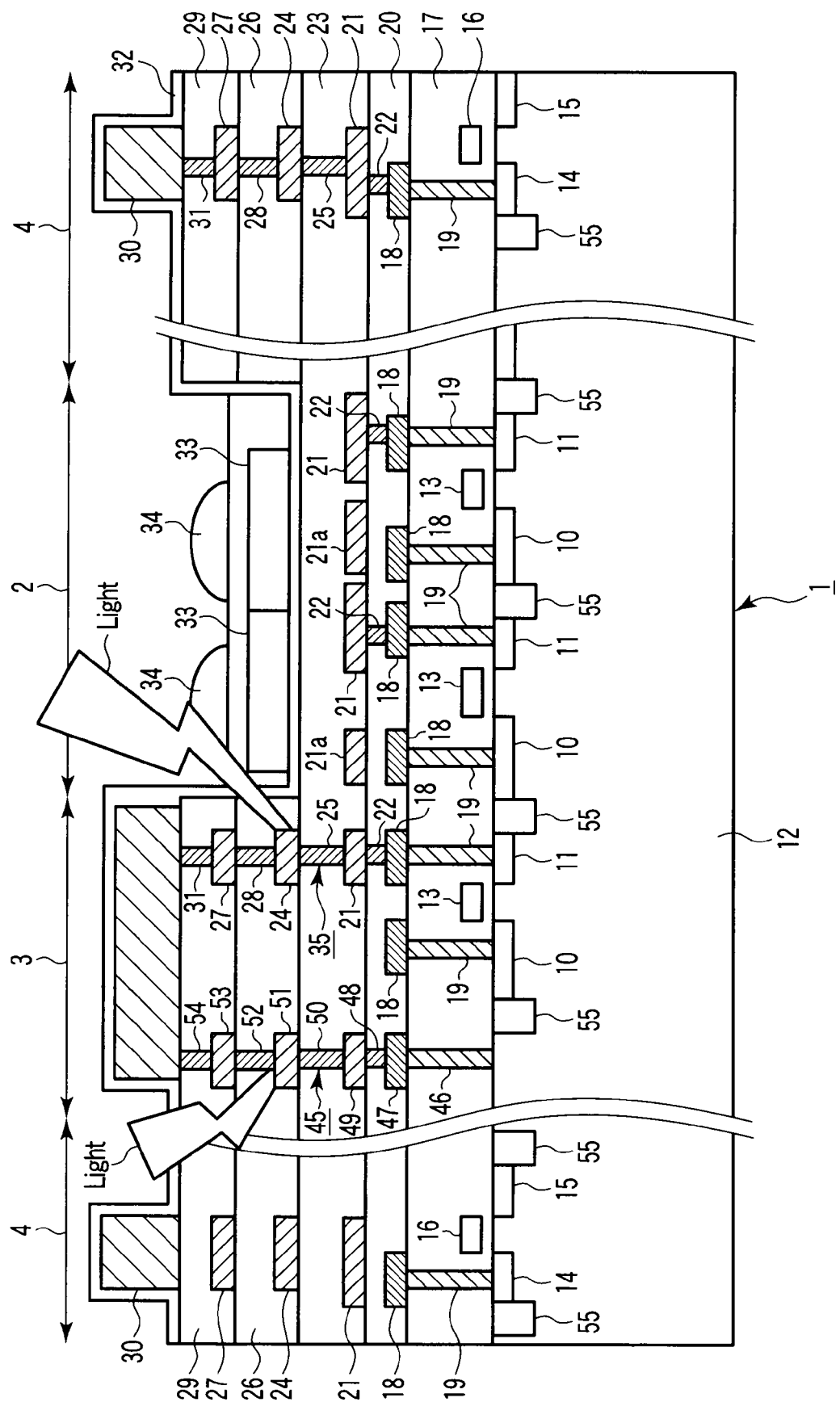
FIG. 7 is a sectional view which shows an example of a state of the solid-state imaging device according to the first embodiment that an inclined incident light enters from an imaging area into an OB area and from a peripheral circuit area into an OB area.

On the contrary, FIG. 7 is a sectional view which shows an example of a state of the solid-state imaging device 1 according to the present embodiment that the inclined incident light enters from the imaging area 2 into the OB area 3 and from the peripheral circuit area 4 into the OB area 3.

In the present embodiment, the shielding unit 35 is arranged in the OB area 3 between the photoelectric conversion layer of the OB area 3 and the imaging area 2.

Even in the case that the inclined incident light enters into the OB area 3 from the side face portion of the OB area 3 which is generated because the OB area 3 is higher than the imaging area 2, the shielding unit 35 shields the inclined incident light entering from the side face. Therefore, the entering of the inclined incident light into the photoelectric conversion layer of the OB area 3 from the imaging area 2 can be prevented and fluctuation of the black reference level can be prevented.

Further, in the present embodiment, the shielding unit 45 is arranged in the OB area 3 between the photoelectric conversion layer of the OB area 3 and the periphery circuit area 4. The entering of the incident light into the photoelectric conversion layer from the peripheral circuit area 4 side can be prevented by the shielding unit 45.

Further, in the present embodiment, the black reference level can be stably ensured without utilizing the dummy pixels. Therefore, the dummy pixel area can be deleted or decreased and downsizing and cost reduction of the solid-state imaging device can be achieved.

An example of the method of manufacturing the solid-state imaging device 1 which has the shielding unit 35 according to the present embodiment is explained in the following. Here, the method of manufacturing the solid-state imaging device 1 which has the shielding unit 45 is the same.

Figure 8:
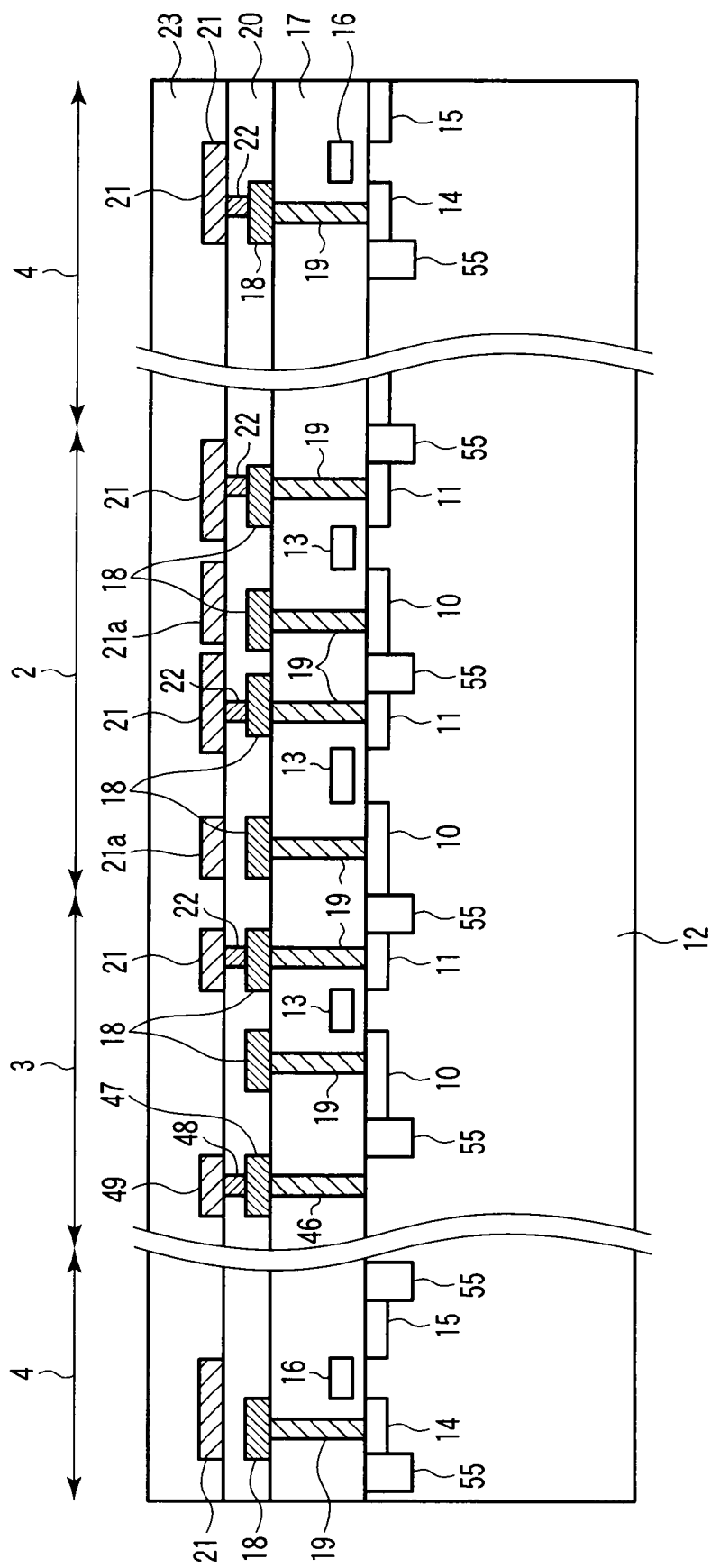
FIG. 8 is a diagram which shows an example of a section of the solid-state imaging device according to the first embodiment at a midstream of a manufacturing process.

FIG. 8 is a diagram which shows an example of a section of the solid-state imaging device 1 at a midstream of the manufacturing process.

First, an element-isolation area 55 which consists of insulating film is formed at the semiconductor substrate 12 which comprises silicon, for example. The imaging area 2, the OB area 3 and the peripheral circuit area 4 are element-isolated and elements within each area are also element-isolated.

Next, the gate insulating film is formed on the semiconductor substrate 12. The gate electrodes 13 and 16 are formed at desired positions on the gate insulating film. The source area 14 and the drain area 15 are formed at the peripheral circuit area 4 by ion implantation. The charge storage layer 10, the diffusion layer 11 and the photoelectric conversion layer (not shown in the figures) are formed at the imaging area 2 and the OB area 3.

Next, the first insulating film 17 is accumulated on the entire face of the semiconductor substrate 12. The accumulated first insulating film 17 is flattened by utilizing the chemical mechanical polishing (CMP).

Next, contact holes which are respectively communicated with the diffusion layer 11 and either of the source area 14 and the drain area 15 are formed at the first insulating film 17 by utilizing the lithography technology. The contact 19 and the first interconnect layer 18 comprises W or Cu, for example.

Next, the second insulating film 20 is accumulated on the entire face of the first insulating film 17 on which the first interconnect layer 18 is formed. The accumulated second insulating film 20 is flattened by utilizing the CMP.

Next, contact holes which are communicated with the first interconnect layer 18 are formed at the desired positions of the second insulating film 20 of the imaging area 2, the OB area 3 and the peripheral circuit area 4 by utilizing the lithography technology. The contact 22 and the second interconnect layer 21 comprise W or Cu, for example.

Next, the third insulating film 23 is accumulated on the entire face of the second insulating film 20 on which the second interconnect layer 21 is formed. The accumulated third insulating film 23 is flattened by utilizing the CMP.

The method of manufacturing the imaging device after the step of FIG. 8 is explained with reference to FIG. 3.

Next, contact holes are formed at the third insulating film 23 of the OB area 3 and the peripheral circuit area 4 by utilizing the lithography technology. The contact 25 and the third interconnect layer 24 comprise W or Cu, for example.

Next, the fourth insulating film 26 is accumulated on the third insulating film 23 of the OB area 3 and the peripheral circuit area 4 on which the third interconnect layer 24 is formed. The accumulated fourth insulating film 26 is flattened by utilizing the CMP.

Next, contact holes which are communicated with the third interconnect layer 24 are formed at the desired positions of the fourth insulating film 26 of the OB area 3 and the peripheral circuit area 4 by utilizing the lithography technology. The contact 28 and the fourth interconnect layer 27 comprise W or Cu, for example.

Next, the fifth insulating film 29 and the fifth interconnect layer 30 are formed under the similar condition to the fourth insulating film 26 and the fourth interconnect layer 27.

Next, the flattening layer 32 which is made of organic material (resist material etc.), for example, is accumulated so as to cover the front face side of the solid-state imaging device at the midstream of the manufacturing process, namely, so as to cover the third insulating film 23 at the imaging area 2, the fifth insulating film 29 on which the fifth interconnect layer 30 is formed at the OB area 3 and the peripheral circuit area 4, the side face portions of the fourth and the fifth insulating films 26, 29 of the imaging area 2 side at the OB area 3.

Then, the color filter 33 and the microlens 34 are formed on the flattening layer 32 of the imaging area 2.

Here, the solid-state imaging device 1 according to the present embodiment has the interconnect structure of five layers. However, the total number of the interconnect can be freely determined in accordance with the design. Although the damascene Cu interconnect can be utilized in the present embodiment, Al interconnect or other metal interconnect can also be utilized.

In the MOS solid-state imaging device 1 which utilizes the Cu interconnect as the multi-layer interconnect according to the present embodiment, the shielding unit 35 which is formed by the contacts 19, 22, 25, 28, 31 and the interconnect layers of the first through the fifth 18, 21, 24, 27, 30 and which shields the light incident from the imaging area 2 to the photoelectric conversion layer of the OB area 3 is formed between the imaging area 2 and the photoelectric conversion layer of the OB area 3.

Accordingly, even in the case that the imaging area 2 is lower than the OB area 3, the light incident from the side face portion at the imaging area 2 side of the OB area 3 can be shielded and the black reference level can appropriately be observed. Therefore, the invalid area (dummy pixel area) of the OB area 3 can be decreased or deleted and the solid-state imaging device 1 can be downsized.

In the present embodiment, the inclined light incident from the imaging area 2 to the OB area 3 is shielded and deliberate desired imaging characteristics can be obtained. In addition, high integration and high speed operation can be performed.

The shielding unit 45 which is formed by the contact 46, the interconnect layer 47, the contact 48, the interconnect layer 49, the contact 50, the interconnect layer 51, the contact 52, the interconnect layer 53, the contact 54 and the fifth interconnect layer 30 and which shields the light incident from the peripheral circuit area 4 to the photoelectric conversion layer of the OB area 3 is formed between the peripheral circuit area 4 and the photoelectric conversion layer of the OB area 3.

Accordingly, the entering of the light incident from the peripheral circuit area 4 to the photoelectric conversion layer of the OB area 3 can be prevented and favorable imaging characteristics can be obtained.

In the present embodiment, the shielding unit 35 and the shielding unit 45 are formed at the OB area 3. However, the shielding unit which shields the light incident from the imaging area 2 to the OB area 3 can be formed at the imaging area 2 or between the imaging area 2 and the OB area 3, for example. The shielding unit which shields the light incident from the peripheral circuit area 4 to the OB area 3 can be formed at the peripheral circuit area 4 or between the OB area 3 and the peripheral circuit area 4, for example.

The Second Embodiment

In the present embodiment, a specific application example of the solid-state imaging device 1 according to the first embodiment is explained.

Figure 9:
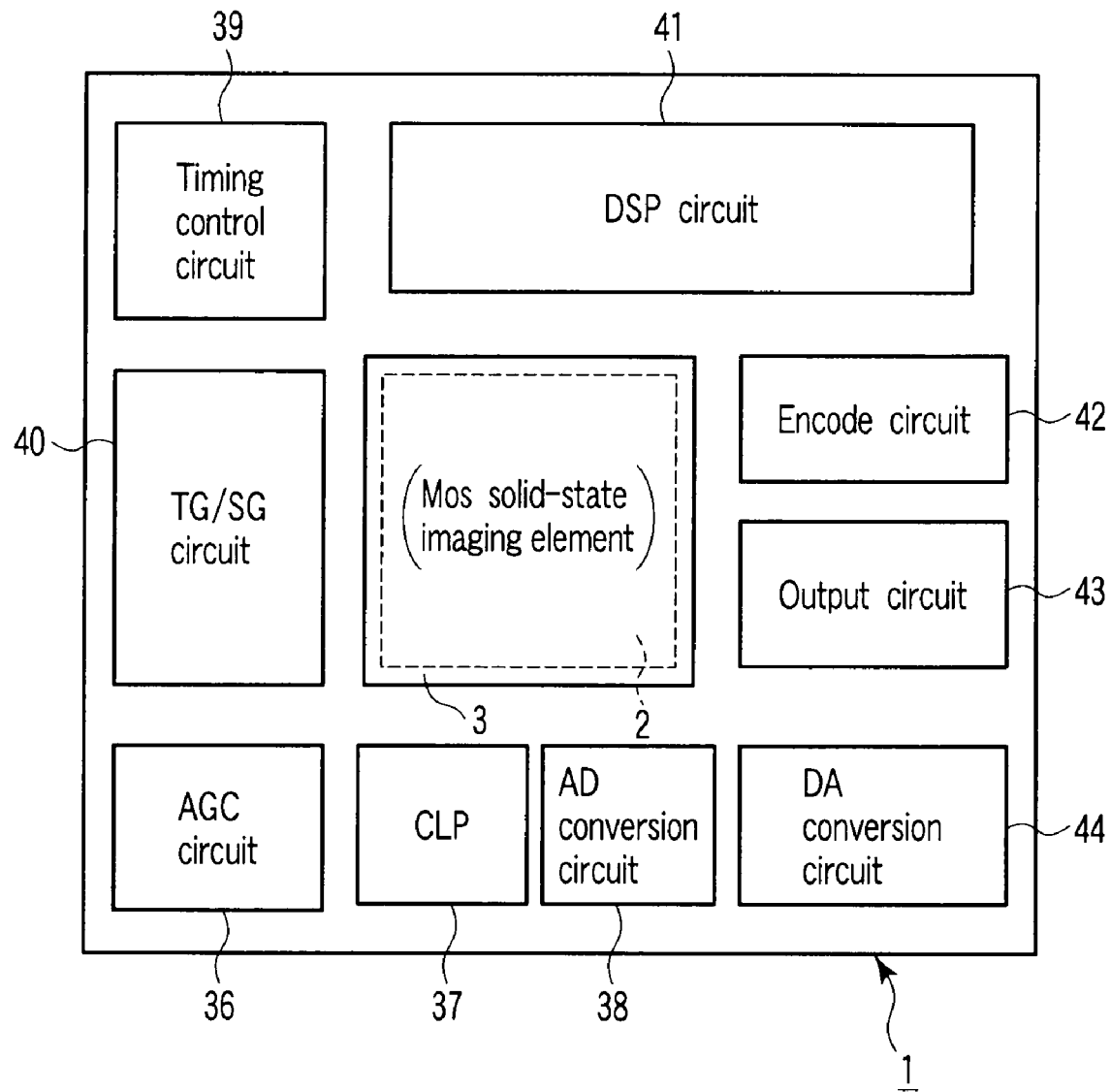
FIG. 9 is a top view which shows an example of an solid-state imaging device according to a second embodiment of a present invention.

FIG. 9 is a top view which shows an example of the solid-state imaging device 1 according to the present embodiment. In FIG. 9, the case that the solid-state imaging device 1 is a video camera is explained as the example. Here, the solid-state imaging device 1 is applicable to various equipment of, for example, mobile equipment, such as a digital camera and a cellular phone.

In the solid-state imaging device 1 according to the present embodiment, the MOS solid-state imaging element and the peripheral circuit are formed on one chip. The MOS solid-state imaging element is formed at the imaging area 2 and the OB area 3.

The peripheral circuit such as a signal processing circuit which processes the output signal of the solid-state imaging device 1 is structured by MOS transistors. Therefore, the manufacturing processes of the MOS solid-state imaging element and the peripheral circuit can be commonly performed. Accordingly, the MOS solid-state imaging element and the peripheral circuit are formed on the same semiconductor substrate 12.

The solid-state imaging device 1 has the MOS solid-state imaging element (MOS sensor), an automatic gain control circuit (hereinafter, called an AGC circuit) 36, a clamp circuit (hereinafter, called an CLP circuit) 37, an AD (analog-to-digital) conversion circuit 38, a timing control circuit 39, a timing generator/signal generator circuit (hereinafter, TG/SG circuit) 40, a DSP circuit 41, an encoding circuit 42, an output circuit 43 and a DA (digital-to-analog) conversion circuit 44.

The AGC circuit 36 adjusts a level of a voltage signal. The CLP circuit 37 clamps the voltage signal. The AD conversion circuit 38 converts analog signals into digital signals. The timing control circuit 39 controls the timing of a video camera by generating a clock pulse. The TG/SG circuit 40 generates a timing signal and a drive control signal for drive control of the MOS solid-state imaging element in synchronization with the clock pulse. The DSP circuit 41 processes the digital signal which is an output of the AD conversion circuit 38. The encoding circuit 42 encodes the output of the DSP circuit 41. The output circuit 43 outputs the encoded signal. The DA conversion circuit 44 converts the output of the output circuit 43 into an analog signal.

The image voltage signal which is photoelectrically converted by the MOS solid-state imaging element is clamped by the CLP circuit 37 after being adjusted of the level by the AGC circuit 36 and transferred to the AD conversion circuit 38. Then, the image voltage signal is converted into a digital image signal which one sample value consists of 8 bits for example by the AD conversion circuit 38 and transferred to the DSP circuit 41. The DSP circuit 41 has a color isolation circuit, a clamp circuit, a gamma correction circuit, a white correction circuit, a black correction circuit, a two-one circuit, a color balance circuit and the like, for example, and performs necessary signal processes to the supplied digital image signal. Then, the signal which is processed by the DSP circuit 41 is transferred to the encode circuit 42. The encoding circuit 42 encodes and converts the transferred image signal into a luminance signal and a color difference signal.

The timing of the MOS solid-state imaging element is controlled with the timing signal and the drive control signal which are transferred from the TG/SG circuit 40.

The image signal which is encoded by the encoding circuit 42 is supplied to the DA conversion circuit 44 via the output circuit 43. The signal is converted into an analog video signal by the DA conversion circuit 44 and output to an external unit.

In the solid-state imaging device 1, the peripheral circuits having various functions are formed on the same chip of the MOS solid-state imaging element. Accordingly, increasing the number of the pixels and downsizing of the module can be achieved. The solid-state imaging device 1 has the structure which places emphasis on the imaging characteristics.

In the solid-state imaging device 1 according to the present embodiment, the front face of the insulating film at the imaging area 2 is flattened and lowered than the front face of the insulating film at the peripheral circuit area 4 (the thickness is reduced). Accordingly, the image light signal incident on the microlens is easy condensed on the photoelectric conversion layer of the imaging area 2 and favorable imaging characteristics can be obtained.

By adopting the multi-layer interconnect structure to the peripheral circuit area 4, enhancement of the integration and the speed of the peripheral circuits can be realized.

At the imaging area 2 side in the OB area 3, entry of the light incident on the side face of the OB area 3 can be prevented by the shielding unit 35. Therefore, the inclined light entering from the imaging area 2 side into the OB area 3 is shielded and observing the inclined light by the photoelectric conversion layer at the OB area 3 can be prevented. Consequently, the fluctuation of the black reference level can be prevented.

In a general solid-state imaging device 1, the dummy pixels are disposed in order to ensure the stable black reference level. However, in the present embodiment, the area for the dummy pixels can be decreased or deleted.

What is claimed is:

1. An imaging device comprising:
   a first photoelectric conversion unit which is formed at an imaging area of a semiconductor substrate;
   a second photoelectric conversion unit for black reference observation which is formed at an optical black area between the imaging area of the semiconductor substrate and a peripheral circuit area where a peripheral circuit is formed;

an insulating film which is formed on the imaging area and the optical black area of the semiconductor substrate;

an interconnect layer which is formed at a top surface of the insulating film; and a shielding unit which is formed by connecting a contact and an interconnect in an accumulating direction of the insulating film from the semiconductor substrate surface to the interconnect layer.

2. An imaging device according to claim 1, wherein the shielding unit is formed at the optical black area between the imaging area of the semiconductor substrate and the position where the second photoelectric conversion unit is formed.

3. An imaging device according to claim 1,
wherein the insulating film is formed by accumulating a plurality of layers at the optical black area, and
wherein the shielding unit is formed by connecting interconnects which are respectively formed at each of the plurality of layers with a plurality of contacts in an accumulating direction of the plurality of layers.

4. An imaging device according to claim 1, wherein the shielding unit is formed so that at least a part of the shielding unit is to be wall-shaped along all or a selective part of the periphery of the imaging area.

5. An imaging device according to claim 1,
wherein the shielding unit comprises, at the optical black area, a first shielding unit which is formed between the imaging area of the semiconductor substrate and a position where the second photoelectric conversion unit is formed and a second shielding unit which is formed between the peripheral circuit area of the semiconductor substrate and the position where the second photoelectric conversion unit is formed.

6. An imaging device according to claim 5,
wherein the insulating film is formed by accumulating a plurality of layers at the optical black area, and
the first shielding unit and the second shielding unit are formed by connecting interconnects which are respectively formed at each of the plurality of layers with a plurality of contacts in an accumulating direction of the plurality of layers.

7. An imaging device according to claim 5,
wherein the first shielding unit is formed so that at least a part of the first shielding unit is to be wall-shaped along all or a selective part of the periphery of the imaging area, and
the second shielding unit is formed so that at least a part of the second shielding unit is to be wall-shaped along all or a selective part of the inside perimeter of the peripheral circuit area.

8. An imaging device according to claim 1, wherein at least a part of the shielding unit comprises W or Cu.

9. A method of manufacturing an imaging device comprising:

forming an element isolation area on a semiconductor substrate for performing element isolation among an imaging area, an optical black area and a peripheral circuit area and isolating an element within each of the areas;

forming an electronic circuit including a photoelectric conversion layer at the imaging area and the optical black area of the semiconductor substrate and forming a peripheral circuit at the peripheral circuit area;

accumulating an insulating film on the semiconductor substrate to which the electronic circuit and the peripheral circuit are formed;

forming an interconnect layer at a top surface of the insulating film and forming a shielding unit in which a contact and an interconnect are connected in an accumulating direction of the insulating film from the semiconductor substrate surface to the interconnect layer; and forming a color filter and a microlens at the imaging area of the semiconductor substrate.

10. A method according to claim 9, wherein the shielding unit is formed at the optical black area between the imaging area of the semiconductor substrate and the position where a second photoelectric conversion unit is formed.

11. A method according to claim 9, wherein the insulating film is formed by accumulating a plurality of layers at the optical black area, and
wherein the shielding unit is formed by connecting interconnects which are respectively formed at each of the plurality of layers with a plurality of contacts in an accumulating direction of the plurality of layers.

12. A method according to claim 9, wherein the shielding unit is formed so that at least a part of the shielding unit is to be wall-shaped along all or a selective part of the periphery of the imaging area.

13. A method according to claim 9, wherein the shielding unit comprises, at the optical black area, a first shielding unit which is formed between the imaging area of the semiconductor substrate and a position where a second photoelectric conversion unit is formed and a second shielding unit which is formed between the peripheral circuit area of the semiconductor substrate and the position where the second photoelectric conversion unit is formed.

14. A method according to claim 13,
wherein the insulating film is formed by accumulating a plurality of layers at the optical black area, and
the first shielding unit and the second shielding unit are formed by connecting interconnects which are respectively formed at each of the plurality of layers with a plurality of contacts in an accumulating direction of the plurality of layers.

15. A method according to claim 13,
wherein the first shielding unit is formed so that at least a part of the first shielding unit is to be wall-shaped along all or a selective part of the periphery of the imaging area, and
the second shielding unit is formed so that at least a part of the second shielding unit is to be wall-shaped along all or a selective part of the inside perimeter of the peripheral circuit area.

16. A method according to claim 9, wherein at least a part of the shielding unit comprises W or Cu.

17. An imaging device comprising:

a first photoelectric conversion unit which is formed at an imaging area of a semiconductor substrate;

a second photoelectric conversion unit for black reference observation which is formed at an optical black area between the imaging area of the semiconductor substrate and a peripheral circuit area where a peripheral circuit is formed;

a first insulating film which is formed on the imaging area and the optical black area of the semiconductor substrate;

a second insulating film which is formed on the optical black area of the first insulating film, a top surface of the second insulating film being higher than a top surface of the first insulating film;

an interconnect layer which is formed at the top surface of the second insulating film; and a shielding unit which is formed by connecting a contact and an interconnect in an accumulating direction of the first and second insulating films from the semiconductor substrate surface to the interconnect layer.

18. An imaging device according to claim 1, further comprising a diffusion unit which is formed at an optical black area of the semiconductor substrate, the diffusion unit being connected to the shielding unit.

* * * * *